United States Patent
Ritchie et al.

(10) Patent No.: US 11,162,170 B2
(45) Date of Patent: Nov. 2, 2021

(54) METHODS FOR REDUCING MATERIAL OVERHANG IN A FEATURE OF A SUBSTRATE

(71) Applicant: APPLIED MATERIALS, INC., Santa Clara, CA (US)

(72) Inventors: Alan A. Ritchie, Menlo Park, CA (US); Zhenbin Ge, San Jose, CA (US); Jenn Yue Wang, Fremont, CA (US); Sally Lou, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1508 days.

(21) Appl. No.: 14/599,831

(22) Filed: Jan. 19, 2015

(65) Prior Publication Data

US 2015/0221486 A1 Aug. 6, 2015

Related U.S. Application Data

(60) Provisional application No. 61/936,844, filed on Feb. 6, 2014.

(51) Int. Cl.
*C23C 14/58* (2006.01)
*C23C 14/34* (2006.01)
*H01J 37/34* (2006.01)

(52) U.S. Cl.
CPC ...... *C23C 14/5873* (2013.01); *C23C 14/3492* (2013.01); *C23C 14/5826* (2013.01); *H01J 37/34* (2013.01); *H01J 37/3464* (2013.01); *H01J 2237/3322* (2013.01)

(58) Field of Classification Search
CPC ............ C23C 14/5873; C23C 14/3492; C23C 14/046; C23C 14/06; C23C 14/5826; H01J 37/3464; H01J 37/34
See application file for complete search history.

(56) References Cited

U.S. PATENT DOCUMENTS

| 5,654,233 A | 8/1997 | Yu |
| 5,693,562 A | 12/1997 | Tseng |
| 6,365,009 B1 * | 4/2002 | Ishibashi ................. C23C 14/35 204/192.12 |
| 6,605,197 B1 * | 8/2003 | Ding ................. H01L 21/76877 204/192.15 |

(Continued)

FOREIGN PATENT DOCUMENTS

WO  WO 2002/09149 A2  1/2002

OTHER PUBLICATIONS

International Search Report and Written Opinion dated May 22, 2015 for PCT Application No. PCT/US2015/013423.

*Primary Examiner* — Michael A Band
(74) *Attorney, Agent, or Firm* — Moser Taboada

(57) ABSTRACT

Embodiments of methods for depositing material in features of a substrate have been provided herein. In some embodiments, a method for depositing material in a feature of a substrate includes depositing a material in a feature of a substrate disposed in a process chamber by sputtering a target using a plasma formed from a first gas; and etching the deposited material in the process chamber using a plasma formed from a second gas, different than the first gas, to at least partially reduce overhang of the material in the feature, wherein an atomic mass of the second gas is greater than an atomic mass of the first gas.

18 Claims, 3 Drawing Sheets

(56) References Cited

U.S. PATENT DOCUMENTS

| | | | |
|---|---|---|---|
| 8,298,936 B1 * | 10/2012 | Rozbicki | C23C 14/046 |
| | | | 257/E21.169 |
| 2004/0188239 A1 | 9/2004 | Robinson et al. | |
| 2006/0030151 A1 | 2/2006 | Ding et al. | |

* cited by examiner

METHODS FOR REDUCING MATERIAL OVERHANG IN A FEATURE OF A SUBSTRATE

CROSS-REFERENCE TO RELATED APPLICATIONS

This application claims benefit of U.S. provisional patent application Ser. No. 61/936,844, filed Feb. 6, 2014, which is herein incorporated by reference in its entirety.

FIELD

Embodiments of the present disclosure generally relate to thin film substrate processing techniques.

BACKGROUND

Fabrication of integrated circuits and other microelectronic devices include processes to fill tiny features formed in or on a substrate. For example, such features may be filled with a conductive material to form a conductive pathway between devices or regions of an integrated circuit or microelectronic device. In some processes, such as physical vapor deposition (PVD), a substrate is disposed on a substrate support inside a process chamber and opposite a target of material to be deposited on the substrate. A plasma is formed from a process gas inside of the process chamber to sputter the material from the target and to deposit the material onto the substrate and within the features. These processes can be used to form a layer along the surfaces of the feature and/or to completely fill the feature.

The inventors have observed that one of the most challenging aspects of PVD processes with ever-shrinking semiconductor devices is the buildup of overhang in the features and the incapability to provide sufficient step coverage (e.g., coverage on bottom and sidewalls of the feature as compared to the top surface of the substrate), or more specifically, sidewall coverage with no overhang on the feature top. In particular, the undesirable buildup of material near the upper opening of the features, referred to as overhang, can cause the opening of the feature to be closed off prematurely, undesirably forming a pocket, or void, where no material is present.

Therefore, the inventors have provided improved methods for depositing materials in features of a substrate.

SUMMARY

Embodiments of methods for depositing material in features of a substrate have been provided herein. In some embodiments, a method for depositing material in a feature of a substrate includes depositing a material in a feature of a substrate disposed in a process chamber by sputtering a target using a plasma formed from a first gas; and etching the deposited material in the process chamber using a plasma formed from a second gas, different than the first gas, to at least partially reduce overhang of the material in the feature, wherein an atomic mass of the second gas is greater than an atomic mass of the first gas.

In some embodiments, a method for depositing material in a feature of a substrate includes depositing a material in a feature of a substrate disposed in a process chamber by sputtering a target using a plasma formed from a first gas, wherein the first gas has a mass ratio to the material of less than or equal to 1:1; and etching the deposited material using a plasma formed from a second gas having an atomic mass ratio to the material of greater than 1:1 to at least partially reduce overhang of the material in the feature.

In some embodiments, a computer readable medium is provided having instructions stored thereon that, when executed, causes a process chamber to perform a method for depositing material in a feature of a substrate. The method may include any of the methods disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
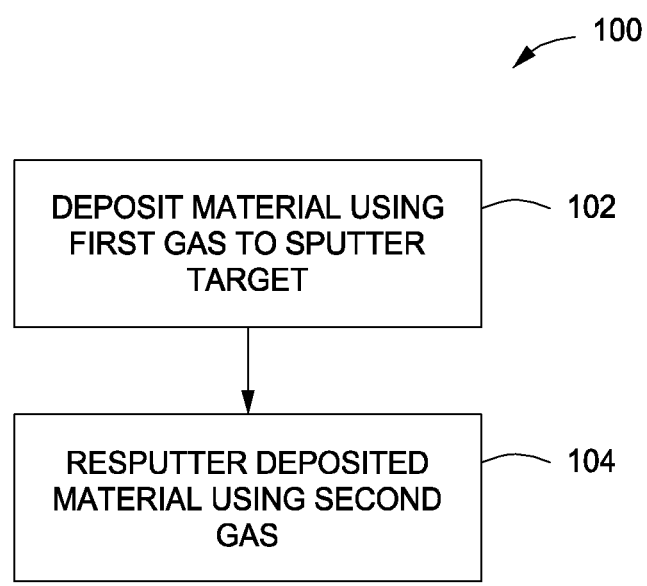
FIG. 1 depicts a flowchart of a method for reducing overhang in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods for depositing material in features formed in or on a substrate are provided herein. Embodiments of the inventive methods may advantageously facilitate reducing or eliminating overhang of material in the feature to lessen the incidence of void formation during feature filling processes.

Figure 2A:
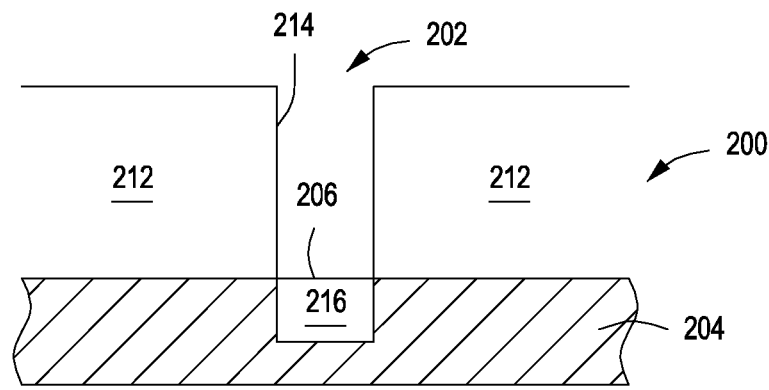
FIGS. 2A-C depict the stages of forming and reducing the overhang in accordance with some embodiments of the present disclosure.

FIG. 1 depicts a flow chart of a method 100 for depositing material in features formed in or on a substrate in accordance with some embodiments of the present disclosure. The method 100 is described below with respect to the stages of processing as depicted in FIG. 2. Further, the method 100 may be performed in any suitable PVD process chamber having both DC and radio frequency (RF) power sources, such as a processing system 300 described below and depicted in FIG. 3.

The method 100 is typically performed on a substrate 200 provided to a physical vapor deposition (PVD) chamber, for example processing system 300 described below with respect to FIG. 3. The substrate 200 includes one or more features 202 to be filled formed in a layer 212 of the substrate 200 and extending towards a base 204 of the substrate 200. The substrate 200 may be any suitable substrate having the one or more features formed in the substrate 200. For example, the substrate 200 may comprise one or more of silicon (Si), silicon oxide ($SiO_2$), or the like. In some embodiments, the layer 212 may be a dielectric layer. In addition, the substrate 200 may include additional layers of materials or may have one or more completed or partially completed structures or devices formed in or on the substrate.

The feature 202 may be formed by etching the substrate using any suitable etch process. The feature 202 includes a bottom surface 206 and one or more sidewalls 214 as shown. The feature 202 may be a via, contact, trench, dual damascene, or the like. In some embodiments, the feature 202 may have a height to width aspect ratio of about up to about 10:1, or about 15:1, or greater. Although the features 202 may generally have any suitable dimensions, in some embodiments, the features 202 may be high aspect ratio features, i.e., a feature having a side wall to width, or bottom, ratio of greater than about 4:1, or in some embodiments, greater than about 10:1 (such as, for example, about 10:1 to about 40:1).

In some embodiments, the bottom surface 206 and the one or more sidewalls 214 may be covered with one or more layers prior to depositing a subsequent material as described below. For example, the bottom surface 206 and sidewalls 214 of the feature 202 and an upper surface of the layer 212 may be covered by an oxide layer, such as silicon oxide ($SiO_2$) or the like. The oxide layer may be deposited or grown, for example in a chemical vapor deposition (CVD) chamber or in a oxidation chamber, prior to providing the substrate 200 to a PVD chamber. The oxide layer may serve as an electrical and/or physical barrier between the layer 212 and another layer or material to be subsequently deposited in the feature, and/or may function as a better surface for attachment during the deposition process discussed below than a native surface of the substrate. For example, in some embodiments, the layer 212 may be a dielectric layer and the subsequently deposited materials may be metal-containing materials.

In some embodiments, a barrier layer may be deposited atop the oxide layer, or atop the bottom surface and sidewalls of the feature 202 and the upper surface of the dielectric if an oxide layer is not present. The barrier layer may serve a similar purpose as the oxide layer discussed above. In some embodiments, the barrier layer may include at least one of titanium (Ti), tantalum (Ta), cobalt (Co), oxides or nitrides of Ti, Ta, and/or Co, or the like. The barrier layer may be deposited by any suitable methods, such as by CVD or PVD, including by using the method 100 described below to form a continuous barrier layer in the feature 202.

In some embodiments, a device 216, such as a logic device or the like, or a portion of a device requiring electrical connectivity, such as a gate, a contact pad, a conductive via, or the like, may be disposed in the base 204 of the substrate 200 and aligned with the feature 202. For example, the feature 202 may be filled with a conductive material to form a conductive pathway to the device 216.

The method 100 generally begins at 102, where a material is deposited on the substrate 200 and within the one or more features 202. The material may be deposited by applying radio frequency (RF) power (such as from an RF power supply 314) at a VHF frequency to a target comprising a material to be deposited on the substrate disposed above the substrate 200 to form a plasma from a first gas. The target may comprise one or more of metals, metal alloys, or the like, of suitable purity to form a continuous barrier layer or a seed layer of a material on the surfaces of the feature 202 and the upper surface of the layer 212. For example, the target may comprise titanium (Ti), tantalum (Ta), copper (Cu), aluminum (Al), cobalt (Co), tungsten (W), combinations and/or alloys thereof, or the like.

The first gas may include one or more noble gases, including, for example, argon (Ar), neon (Ne), krypton (Kr), Xenon (Xe), or the like, or combinations thereof. In some embodiments, the first gas is predominantly the one or more noble gases. In some embodiments, the first gas consists of the one or more noble gases or consists essentially of the one or more noble gases. In some embodiments, the first gas has an atomic mass ratio of less than or equal to 1:1 with respect to the target/deposited material.

The RF power may be applied at a VHF frequency for one or more of forming the plasma from the first plasma-forming gas and ionizing metal atoms sputtered from the target by the plasma. As used herein, a VHF frequency is a frequency in the range of from about 27 MHz to about 162 MHz. In some embodiments, the VHF frequency applied is about 60 MHz. Increasing the VHF frequency may increase the plasma density and/or the amount of ionization in metal atoms sputtered from the target.

In some embodiments, DC power is applied to the target, for example, from a DC power source coupled to the target. The DC power may bias the target to facilitate directing the plasma towards the target. The DC power may range in magnitude from about 1 to about 4 kilowatts (kW). In some embodiments, the DC power may be about 2 kW. The DC power may be adjusted to control the deposition rate of sputtered metal atoms on the substrate. For example, increasing the DC power can result in increased interaction of the plasma with the target and increased sputtering of metal atoms from the target.

Subsequently, atoms are sputtered from the target using the plasma while maintaining a predetermined pressure (e.g. a first pressure) in the PVD chamber sufficient to ionize a predominant portion of atoms being sputtered from the target. For example, a predominant portion of atoms may range from about 50 to about 75 percent of the total number of atoms arriving at the substrate. In some embodiments, and for example, atoms initially sputtered from the target may be mostly non-ionized, and only once they have passed through the plasma will the atoms become ionized. For example, a majority of neutral atoms will be lost to shields of the process chamber, so atoms arriving at the substrate should be predominantly ionized. The predetermined pressure, in addition to the RF power and the DC power applied, may be dependent on process chamber geometry (such as substrate size, target to substrate distance, and the like). For example, the predetermined pressure may range from about 60 to about 300 millitorr (mTorr) in a chamber configured with a target to substrate gap of about 60 millimeters (mm). In some embodiments, the predetermined pressure is about 100 mTorr. The predetermined pressure in the chamber may be maintained by the flow rate of the first gas. The predetermined pressure may provide a high density of gas molecules between the target and the substrate with which sputtered atoms may collide and be ionized. Pressure may be additionally utilized to control the amount of ionization of atoms sputtered from the target. For example, increasing pressure in the chamber and/or increasing the target to substrate gap may increase the number of collisions with sputtered target atoms and thus increase the amount of ionized atoms.

Figure 2B:
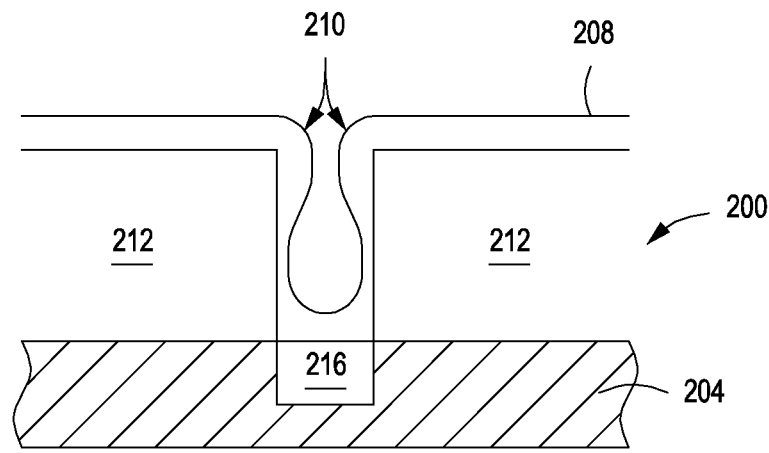

During 102, a film 208 formed of material sputtered from the target is deposited on the upper surface of the layer 212 and on the bottom surface 206 of the feature 202, as illustrated in FIG. 2B. The film 208 is deposited using the processing conditions discussed above, such as the predetermined pressure, RF power, DC power, and/or the VHF frequency. Such processing conditions can facilitate the direction of the plurality of atoms approximately perpendicular to substrate 200. In some embodiments, an optional RF power (e.g., a bias power, or substrate bias power) may be applied to the substrate 200 during the deposition of the plurality of metal atoms. The optional RF power may be applied at a frequency ranging from about 400 kHz to about 27 MHz and at a power of up to about 50 W. In some embodiments, the frequency of the optional RF power may be about 2 MHz, or about 13.56 MHz, or both if an optional second RF power source is additionally coupled a substrate support pedestal of the PVD chamber. The optional RF power may be small to minimize energy of the depositing metal atoms such as to minimize any overhang formation over a mouth of the feature 202.

As illustrated in FIG. 2B, an overhang 210 of the film 208 forms at the edges of the layer 212 surrounding the feature 202 at least in part due to the disorderliness of the deposition process. That is, because the ionized metal atoms travel in multiple directions and are not all directed perfectly downward, the overhang 210 is formed.

The inventors have observed that conventional resputtering processes often performed to reduce overhang actually exacerbate existing overhang problems by either or both of re-depositing sputtered material on existing overhang, or deforming a layer of deposited material to increase a size of the overhang. For example, when ions generated during a resputtering process strike the layer of deposited material on one side of the feature, material may be undesirably re-deposited on the other side of the feature contributing to overhang. Additionally, the inventors have discovered that the impact of ions on the layer of deposited material during processing may cause the layer to deform due to stress, undesirably exacerbating overhang.

The inventors have discovered that the atomic mass ratio of the plasma-forming gas to the deposited material significantly affects a sputtered atom velocity and a sputter angle, impacting overhang formation at the top of the feature. The inventors have also discovered that back-scattering can be minimized using a larger mass plasma gas that results in a very low pressure etching plasma.

Accordingly, at 104, the deposited material is etched, or resputtered, using a second gas, different than the first gas, as the plasma-forming gas. Similar to the first gas, the second gas comprises one or more noble gases, including, for example, argon (Ar), neon (Ne), krypton (Kr), Xenon (Xe), or the like, or combinations thereof. In some embodiments, the second gas is chosen so that an atomic mass of the second gas is greater than an atomic mass of the first gas. In some embodiments, the second gas is chosen so that an atomic mass ratio of the second gas to the deposited material is greater than 1:1. For example, if the deposited material is Ti (atomic mass=48), examples of suitable second plasma-forming gases include, Kr (atomic mass=84) or Xe (atomic mass=131), which yield an atomic mass ratio of 1.8 and 2.7, respectively, with respect to the deposited Ti. However, other combinations of gases may be used to achieve the ratio. In embodiments in which the deposited material is formed of a compound (e.g., SiC), the atomic mass ratio is compared with all of the elements of the compound.

Figure 2C:
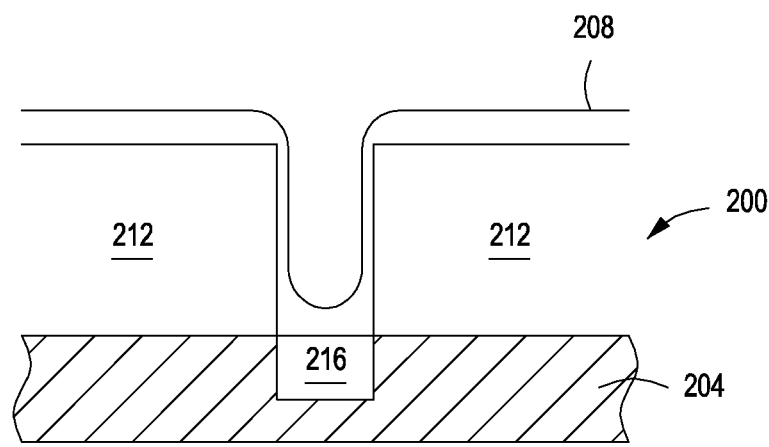

During 104, the overhangs 210 of deposited material are resputtered using the selected second gas. The result of the resputtering process is illustrated in FIG. 2C, which shows a substantially uniform film 208 of deposited material on the sidewalls 214 of the feature 202 without overhang. Although illustrated with no overhang, embodiments of the present disclosure may advantageously reduce overhang sufficient to reduce void formation, but without completely eliminating the overhang.

During 104, the deposited material is etched, or resputtered, using processing conditions, such as a predetermined pressure (e.g., a second pressure), plasma-forming RF power, and substrate bias power which can facilitate the etching process. The predetermined pressure during the etching process at 104 is less than predetermined pressure during the material deposition process at 102. In some embodiments, the predetermined pressure may be dependent on process chamber geometry (such as substrate size, target to substrate distance, and the like) and on the specific second gas used in the process. For example, the predetermined pressure may range from about 1 mTorr to about 30 mTorr. For example, where the second process gas is xenon or krypton, the predetermined pressure is about 1 mTorr to about 10 mTorr. In some embodiments, RF power may be applied for one or more of forming the plasma from the second plasma-forming gas. For example, in some embodiments, RF power may be applied at a power of about 300 to 2000 kW and at a frequency of about 13 MHz to about 60 MHz. In some embodiments, an optional RF power (e.g., a bias power, or substrate bias power) may be applied to the substrate 200 during etching. For example, in some embodiments, the optional RF power may be applied at a frequency ranging from about 2 MHz to about 13 MHz and at a power of about 100 kW to about 1500 kW.

Figure 3:
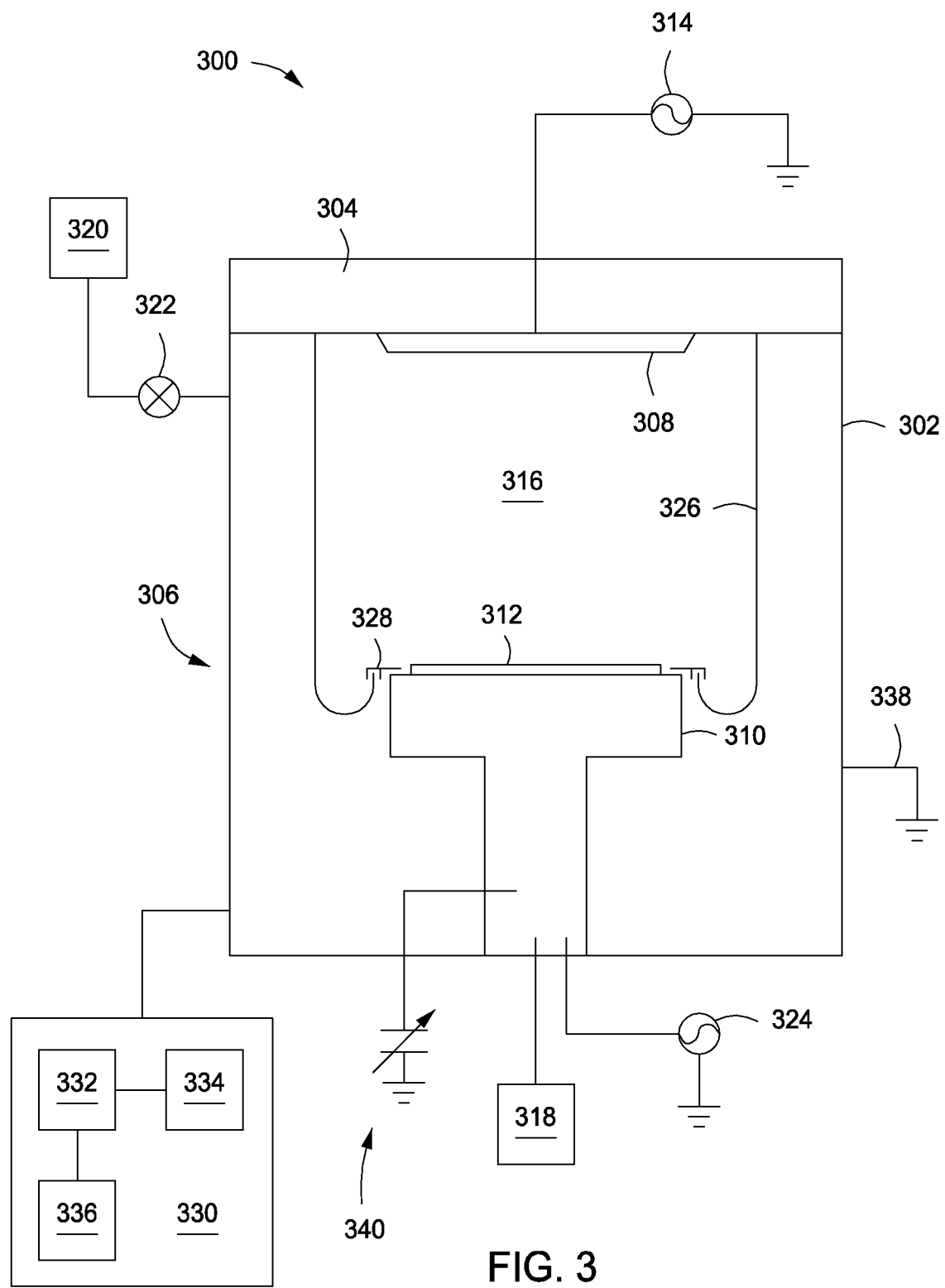
FIG. 3 depicts a schematic, cross-sectional view of a physical vapor deposition (PVD) chamber in accordance with some embodiments of the present disclosure.

FIG. 3 depicts a simplified, cross-sectional view of a processing system 300 suitable to perform a method for depositing a material in the feature of the substrate in accordance with some embodiments of the present disclosure. The processing system 300 may include any suitable process chamber such as, for example, a physical vapor deposition (PVD) process chamber similar to the one described in U.S. Patent Publication No. 2011/0240466. Exemplary process chambers may include the ALPS® Plus and SIP ENCORE® PVD processing chambers, both commercially available from Applied Materials, Inc., of Santa Clara, Calif. Other processing chambers from Applied Materials, Inc. or other manufactures may be used to perform methods in accordance with the teachings disclosed herein.

In some embodiments, the processing system 300 includes a chamber body 302 and a chamber lid 304 removably disposed atop a process chamber 306. The chamber lid 304 may include a target assembly 308. The process chamber 306 contains a substrate support 310 for receiving a substrate 312 thereon. The processing system further includes an RF power supply 314 disposed above the chamber lid 304. The RF power supply 314 may provide RF power to the target assembly 308, as discussed below.

The substrate support 310 has a material-receiving surface facing a principal surface of a target assembly 308 and supports the substrate 312 to be sputter coated in planar position opposite to the principal surface of the target assembly 308. The substrate support 310 may support the substrate 312 in a central region 316 of the process chamber 306. The central region 316 is defined as the region above the substrate support 310 during processing (for example, between the target assembly 308 and the substrate support 310 when in a processing position).

In some embodiments, the substrate support 310 may be vertically movable by a lift mechanism 318 to allow the substrate 312 to be transferred onto the substrate support 310 through a load lock valve (not shown) in the lower portion of the process chamber 306 and thereafter raised to a deposition, or processing position. One or more gases (e.g., the first and second gases) may be supplied from a gas source 320 through a mass flow controller 322 into the central region 316 of the process chamber 306.

An optional RF bias power source 324 may be coupled to the substrate support 310 in order to induce a negative DC bias on the substrate 312. In addition, in some embodiments, a negative DC self-bias may form on the substrate 312 during processing. For example, RF energy supplied by the optional RF bias power source 324 may range in frequency from about 2 MHz to about 60 MHz, for example, non-limiting frequencies such as 2 MHz, 13.56 MHz, or 60 MHz can be used.

Alternatively or in combination, a substrate support impedance circuit, such as a capacitance tuner 340, may be coupled to the substrate support 106 for adjusting voltage on the substrate 312. For example, the substrate support impedance circuit may be used to control the voltage on the substrate 312, and thus, the substrate current (e.g., ion energy at the substrate level).

The process chamber 306 further includes a process kit shield, or shield 326, to surround the processing volume, or central region 316, of the process chamber 306 and to protect other chamber components from damage and/or contamination from processing. The shield 326 extends downwardly and may include a generally tubular portion having a generally constant diameter that generally surrounds the central region 316. The shield 326 extends along the walls of the process chamber 306 downwardly to below a top surface of the substrate support 310 and returns upwardly until reaching a top surface of the substrate support 310 (e.g., forming a u-shaped portion at the bottom of the shield 326). A deposition ring 328 rests on the top of an upwardly extending inner portion of the shield 326 when the substrate support 310 is in the lower, loading position but rests on the outer periphery of the substrate support 310 when the substrate support 310 is in the upper, deposition position to protect the substrate support 310 from sputter deposition. An additional deposition ring (not shown) may be used to protect the edges of the substrate support 310 from deposition around the edge of the substrate 312.

The process chamber 306 generally includes a ground 338 coupled to the chamber body 302 to provide an RF return path to the RF power supply 314. The target assembly 308 may comprise a source material to be deposited on a substrate, such as the substrate 312 during sputtering, such as a metal, metal oxide, metal alloy, or the like.

A controller 330 may be provided and coupled to various components of the processing system 300 to control the operation thereof. The controller 330 includes a central processing unit (CPU) 332, a memory 334, and support circuits 336. The controller 330 may control the processing system 300 directly, or via computers (or controllers) associated with particular process chamber and/or support system components. The controller 330 may be one of any form of general-purpose computer processor that can be used in an industrial setting for controlling various chambers and sub-processors. The memory, or computer readable medium, 334 of the controller 330 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 336 are coupled to the CPU 332 for supporting the processor in a conventional manner. These circuits include cache, power supplies, clock circuits, input/output circuitry and subsystems, and the like. Inventive methods as described herein may be stored in the memory 334 as software routine that may be executed or invoked to control the operation of the processing system 300 in the manner described herein. The software routine may also be stored and/or executed by a second CPU (not shown) that is remotely located from the hardware being controlled by the CPU 332.

Thus, embodiments of methods for depositing material in features of a substrate have been provided herein. While the foregoing is directed to embodiments of the present disclosure, other and further embodiments of the disclosure may be devised without departing from the basic scope thereof.

The invention claimed is:

1. A method for depositing a material in a feature of a substrate, comprising:
   depositing the material in the feature of the substrate disposed in a process chamber by sputtering a target using a plasma formed from a first gas; and
   etching the deposited material in the process chamber using a plasma formed from a second gas, different than the first gas, to at least partially reduce overhang of the material in the feature, wherein an atomic mass of the second gas is greater than an atomic mass of the first gas, and wherein an atomic mass ratio of the second gas to the deposited material is greater than 1:1.

2. The method of claim 1, wherein the first gas comprises one or more noble gases.

3. The method of claim 1, wherein the second gas comprises one or more noble gases.

4. The method of claim 1, wherein the material comprises at least one of titanium (Ti), tantalum (Ta), copper (Cu), aluminum (Al), cobalt (Co), or tungsten (W).

5. The method of claim 1, wherein an atomic mass ratio of the first gas to the material is less than or equal to 1:1.

6. The method of claim 1, wherein the process chamber is at a first pressure during depositing of the material and is at a second pressure during etching of the deposited material.

7. The method of claim 6, wherein the second pressure is less than the first pressure.

8. A method for depositing a compound material in a feature of a substrate, comprising:
   depositing the compound material with a plurality of elements in the feature of the substrate disposed in a process chamber by sputtering a target using a plasma formed from a first gas, wherein the first gas has an atomic mass ratio to each element of the compound material of less than or equal to 1:1; and
   etching the deposited compound material using plasma formed from a second gas having an atomic mass ratio to each element of the compound material of greater than 1:1 to at least partially reduce overhang of the material in the feature.

9. The method of claim 8, wherein etching the deposited compound material is performed in the same process chamber as depositing the compound material.

10. The method of claim 8, wherein the first gas comprises one or more noble gases.

11. The method of claim 8, wherein the second gas comprises one or more noble gases.

12. The method of claim 8, wherein the compound material includes at least one of titanium (Ti), tantalum (Ta), copper (Cu), aluminum (Al), cobalt (Co), and tungsten (W).

13. The method of claim 8, wherein a pressure in the process chamber while sputtering the target is about 60 mTorr to about 300 mTorr.

14. The method of claim 8, wherein sputtering the target further comprises applying RF power to the target at a VHF frequency of about 27 MHz to about 162 MHz.

15. The method of claim 8, wherein sputtering the target further comprises applying DC power to the target at a magnitude of about 1 kW to about 4 kW.

16. The method of claim 8, wherein sputtering the target further comprises applying an RF bias power to the substrate at a frequency ranging from about 400 kHz to about 27 MHz and at a power of up to about 50 W.

17. The method of claim 8, wherein the process chamber is at a first pressure during depositing of the compound material and is at a second pressure during etching of the deposited material.

18. The method of claim 17, wherein the second pressure is less than the first pressure.

* * * * *